US009419168B2

(12) United States Patent
Nakasu et al.

(10) Patent No.: US 9,419,168 B2
(45) Date of Patent: Aug. 16, 2016

(54) METHOD OF MANUFACTURING A SOLAR CELL BY TEXTURING A PRINCIPAL SURFACE USING AN ALKALINE SOLUTION

(71) Applicant: SANYO ELECTRIC CO., LTD., Moriguchi-shi, Osaka (JP)

(72) Inventors: Masato Nakasu, Osaka (JP); Naoya Sotani, Hyogo (JP); Yutaka Kirihata, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/477,965

(22) Filed: Sep. 5, 2014

(65) Prior Publication Data

US 2014/0370644 A1    Dec. 18, 2014

Related U.S. Application Data

(63) Continuation of application No. PCT/JP2013/053981, filed on Feb. 19, 2013.

(30) Foreign Application Priority Data

Mar. 8, 2012    (JP) .................................. 2012-051812

(51) Int. Cl.
| | |
|---|---|
| *H01L 31/18* | (2006.01) |
| *H01L 31/0224* | (2006.01) |
| *H01L 31/0352* | (2006.01) |
| *H01L 31/068* | (2012.01) |
| *H01L 31/0747* | (2012.01) |
| *H01L 31/0236* | (2006.01) |

(52) U.S. Cl.
CPC ........ *H01L 31/182* (2013.01); *H01L 31/02366* (2013.01); *H01L 31/022441* (2013.01); *H01L 31/03529* (2013.01); *H01L 31/0682* (2013.01); *H01L 31/0747* (2013.01); *Y02E 10/547* (2013.01)

(58) Field of Classification Search
None
See application file for complete search history.

(56) References Cited

U.S. PATENT DOCUMENTS

| | | | | |
|---|---|---|---|---|
| 2009/0096351 | A1* | 4/2009 | Hampden-smith et al. | .. 313/504 |
| 2010/0267187 | A1* | 10/2010 | Funakoshi | ...................... 438/72 |
| 2011/0120530 | A1* | 5/2011 | Isaka | ............................. 136/251 |
| 2012/0037227 | A1* | 2/2012 | Takahama | ....... H01L 31/022433 |
| | | | | 136/258 |

FOREIGN PATENT DOCUMENTS

| | | |
|---|---|---|
| JP | 2007-294830 A | 11/2007 |
| JP | 2009-147070 A | 7/2009 |

* cited by examiner

*Primary Examiner* — Charles Garber
*Assistant Examiner* — Brigitte Paterson
(74) *Attorney, Agent, or Firm* — MOTS Law, PLLC

(57) ABSTRACT

A method of manufacturing a solar cell including a crystalline semiconductor substrate, includes: etching or washing at least part of a first principal surface of the substrate by treatment with an aqueous alkaline solution; and depositing a p-type semiconductor layer containing boron on at least part of a second principal surface of the substrate before the treatment with the aqueous alkaline solution.

8 Claims, 4 Drawing Sheets

# METHOD OF MANUFACTURING A SOLAR CELL BY TEXTURING A PRINCIPAL SURFACE USING AN ALKALINE SOLUTION

CROSS REFERENCE TO RELATED APPLICATIONS

This application is a continuation application of International Application No. PCT/JP2013/053981, filed on Feb. 19, 2013, entitled "METHOD OF MANUFACTURING SOLAR CELL", which claims priority based on Article 8 of Patent Cooperation Treaty from prior Japanese Patent Applications No. 2012-051812, filed on Mar. 8, 2012, the entire contents of which are incorporated herein by reference.

BACKGROUND OF THE INVENTION

1. Field of the Invention

This disclosure relates to a method of manufacturing a solar cell.

2. Description of Related Art

In recent years, there has been an increasing demand for further improvement of photoelectric conversion efficiency of heterojunction solar cells (for example, see Patent Document 1). A method of improving light reception efficiency is cited as one of methods of improving the photoelectric conversion efficiency. With regard to the method of improving light reception efficiency, a back contact solar cell in which a heterojunction is provided on the back side has been studied. In addition, studies has been also made on provision of a non-flat structure called a texture structure to a light receiving surface for the purpose of improving the light incident efficiency on the light receiving surface.

Patent Document 1: Japanese Patent Application Publication No. 2007-294830

SUMMARY OF THE INVENTION

In general, the texture structure is formed by anisotropic etching on a surface of a substrate made of a semiconductor material by using an aqueous alkaline solution as an etchant. In manufacturing of a back contact solar cell, a principle surface which is a semiconductor junction surface needs to be protected in the case of forming a texture structure on a light receiving surface.

In addition, in the case of performing a washing process using an aqueous alkaline solution, for example, the principle surface which is the semiconductor junction surface needs to be protected as well.

In an actual situation, however, studies have not been fully made for a protection film suitable for a treatment process using an alkaline etchant as described above. There has been a demand for a method of manufacturing a solar cell with improved photoelectric conversion efficiency by suitably protecting a substrate made of a semiconductor material in a treatment process using an alkaline etchant.

An object of an embodiment of the invention is to provide a method capable of manufacturing a solar cell with improved photoelectric conversion efficiency.

An aspect of the invention is a method of manufacturing a solar cell that includes a substrate made of a crystalline semiconductor material. The method includes: etching or washing at least part of a first principal surface of the substrate by a treatment with an aqueous alkaline solution; and depositing a p-type semiconductor layer containing boron on at least part of a second principal surface of the substrate before the etching or washing step.

According to the above aspect of the invention, it is possible to provide a method capable of manufacturing a solar cell with improved photoelectric conversion efficiency.

DETAILED DESCRIPTION OF EMBODIMENTS

Figure 1:
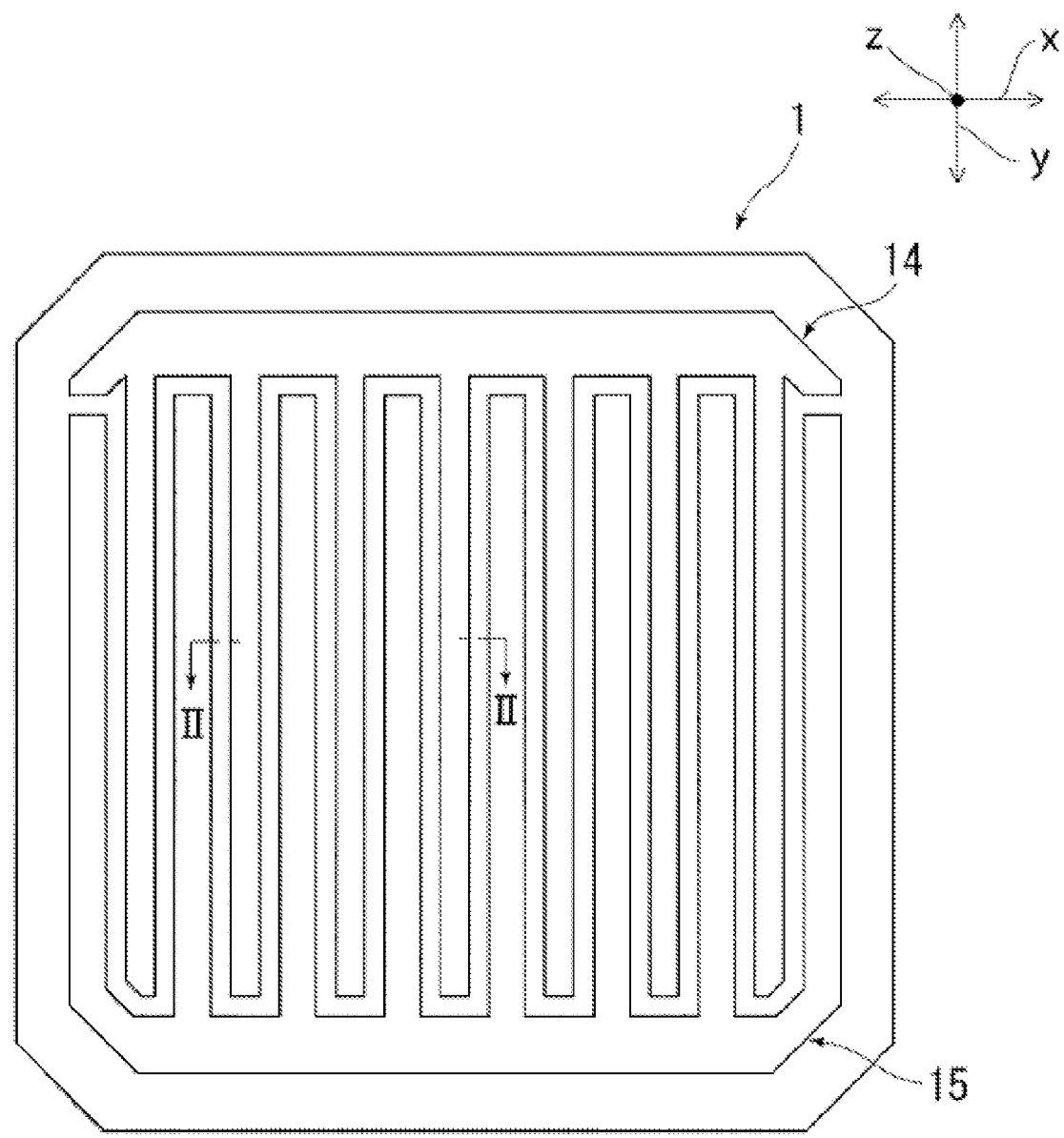
FIG. 1 is a schematic back side view of a solar cell manufactured in a first embodiment.

Hereinafter, examples of preferred embodiments carrying out the invention are described. It should be noted that the following embodiments are provided just for illustrative purposes. The invention should not be limited at all to the following embodiments.

In the drawings referred to in the embodiments and other parts, components having substantially the same function are referred to with the same reference numeral. In addition, the drawings referred to in the embodiments and other parts are illustrated schematically, and the dimensional ratio and the like of objects depicted in the drawings are different from those of actual objects in some cases. The dimensional ratio and the like of objects are also different among the drawings in some cases. The specific dimensional ratio and the like of objects should be determined with the following description taken into consideration.

First Embodiment

Configuration of Solar Cell 1

Firstly, a configuration of solar cell 1 manufactured in an embodiment is described with reference to FIGS. 1 and 2.

Figure 2:
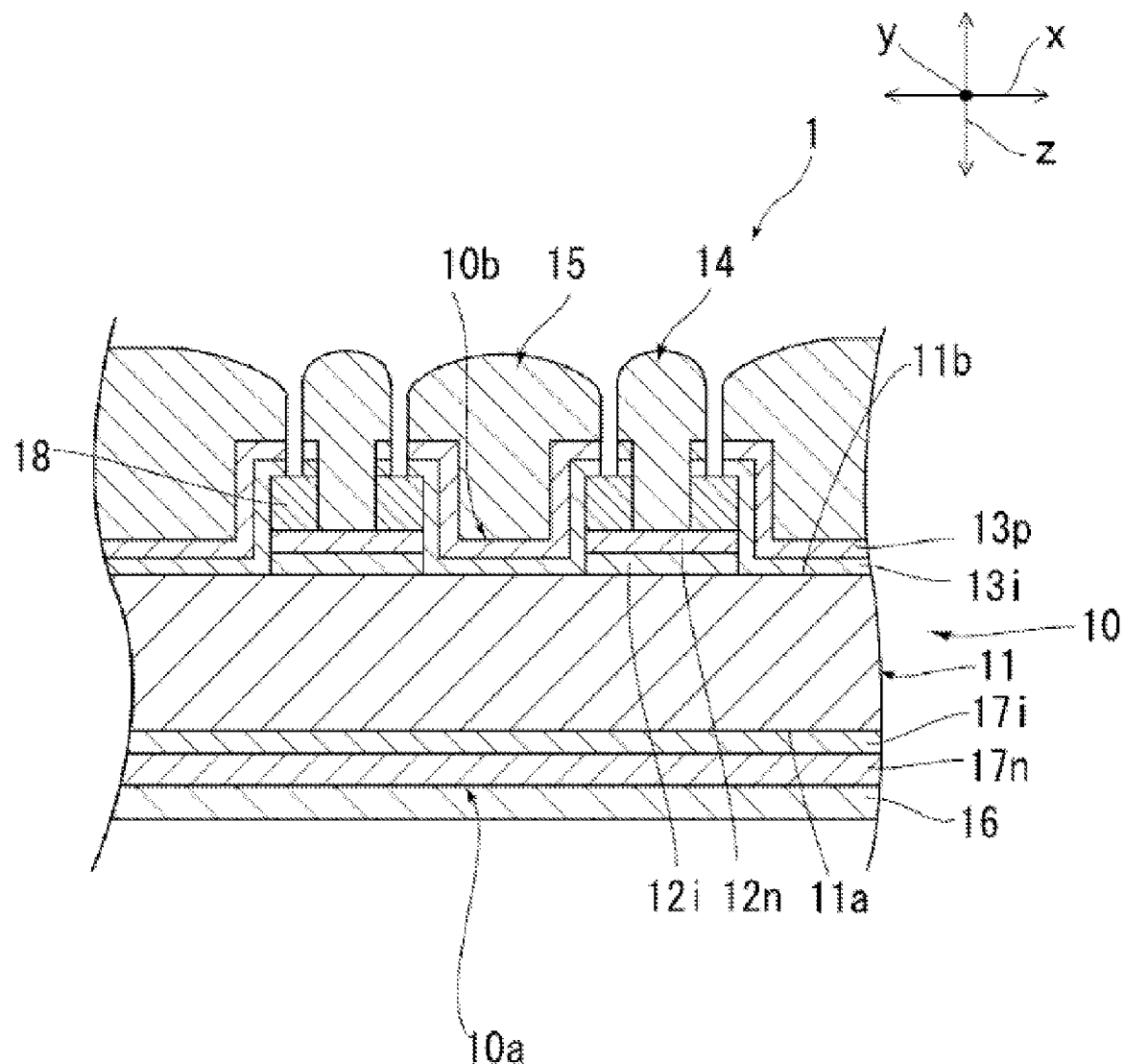
FIG. 2 is a schematic cross-sectional view taken along a line II-II part in FIG. 1.

As illustrated in FIG. 2, solar cell 1 includes photoelectric conversion portion 10. Photoelectric conversion portion 10 generates carriers such as electrons and holes when receiving light. Photoelectric conversion portion 10 includes first and second principal surfaces 10a, 10b. First principal surface 10a constitutes a light receiving surface, whereas second principal surface 10b constitutes a back surface. In this description, a "light receiving surface" is a principal surface at which light is mainly received, and a "back surface" is a principal surface opposed to the light receiving surface. Incidentally, solar cell 1 may be a solar cell that generates power only when receiving light at first principal surface 10a, or may be a bifacial solar cell that generates power not only when receiving light at first principal surface 10a but also when receiving light at second principal surface 10b.

Photoelectric conversion portion 10 includes substrate 11 made of a crystalline semiconductor material. Substrate 11 has one conductivity type. Specifically, in this embodiment, substrate 11 is made of n-type crystalline silicon. Here, the "crystalline silicon" includes monocrystalline silicon and polycrystalline silicon.

Substrate 11 has first and second principal surfaces 11a, 11b. Substrate 11 is arranged such that first principal surface 11a faces first principal surface 10a and second principal surface 11b faces second principal surface 10b.

First principal surface 11a is provided with a texture structure, whereas second principal surface 11b is not provided with a texture structure. Second principal surface 11b has a lower surface roughness than first principal surface 11a. Second principal surface 11b is substantially flat.

Note that the "texture structure" is a non-flat structure formed to suppress surface reflection and to increase light absorption of the photoelectric conversion portion. A specific example of a texture structure is a non-flat structure having projections in pyramid (quadrangular pyramid or quadrangular frustum) shapes obtained by anisotropic etching on a monocrystalline silicon substrate with (100) plane.

N-type semiconductor layer 17n that has the same conductivity type as substrate 11 is arranged on first principal surface 11a. A surface of semiconductor layer 17n constitutes first principal surface 10a of photoelectric conversion portion 10. N-type semiconductor layer 17n may be made of amorphous silicon containing an n-type dopant, for example. Here, the thickness of n-type semiconductor layer 17n is preferably 2 nm to 50 nm, and more preferably 5 nm to 30 nm.

Substantially-intrinsic i-type semiconductor layer 17i is disposed between n-type semiconductor layer 17n and substrate 11. I-type semiconductor layer 17i may be made of substantially-intrinsic i-type amorphous silicon, for example. The thickness of i-type semiconductor layer 17i is preferably about several Å to 250 Å, for example, that is a thickness at which i-type semiconductor layer 17i does not substantially contribute to power generation.

Anti-reflection layer 16 is provided on n-type semiconductor layer 17n. Anti-reflection layer 16 has a function to enhance efficiency of light incidence to photoelectric conversion portion 10 by suppressing light reflection on first principal surface 10a of photoelectric conversion portion 10. Anti-reflection layer 16 may be made of, for example, silicon oxide, silicon nitride, or silicon oxynitride. The thickness of anti-reflection layer 16 is preferably about 80 nm to 1 μm, for example.

Semiconductor layers 12n, 13p constituting second principal surface 10b as the back surface are arranged on second principal surface 11b of substrate 11. These semiconductor layers 12n, 13p form semiconductor junctions on the principal surface 11b side. Semiconductor layer 12n is arranged to cover a portion of second principal surface 11b, and semiconductor layer 13p is arranged to cover another portion of second principal surface 11b. In this embodiment, these semiconductor layers 12n, 13p substantially entirely cover second principal surface 11b.

Semiconductor layer 12n has n-type conductivity that is the same conductivity type as substrate 11. Semiconductor layer 12n may be made of, for example, amorphous silicon containing an n-type dopant. The thickness of semiconductor layer 12n is preferably 2 nm to 50 nm, and more preferably 4 nm to 30 nm.

Substantially-intrinsic i-type semiconductor layer 12i is disposed between semiconductor layer 12n and substrate 11. I-type semiconductor layer 12i may be made of, for example, substantially-intrinsic i-type amorphous silicon. The thickness of semiconductor layer 12i is preferably about several Å to 250 Å, for example, that is a thickness at which i-type semiconductor layer 12i does not substantially contribute to power generation.

Semiconductor layer 13p has p-type conductivity that is a conductivity type different from that of substrate 11. Semiconductor layer 13p may be made of, for example, amorphous silicon containing boron as a p-type dopant. The higher the boron concentration in semiconductor layer 13p, the more preferable. For example, preferable semiconductor layer 13p is formed with a flow ratio of diborane ($B_2H_6$)/silane ($SiH_4$) set to 0.09 or higher. The thickness of semiconductor layer 13p is preferably 1 nm to 40 nm, and is more preferably 2 nm to 20 nm.

Substantially-intrinsic i-type semiconductor layer 13i is disposed between semiconductor layer 13p and substrate 11. Semiconductor layer 13i may be made of, for example, substantially-intrinsic i-type amorphous silicon. The thickness of semiconductor layer 13i is preferably about several Å to 250 Å, for example, that is a thickness at which semiconductor layer 13i does not substantially contribute to power generation.

Portions of semiconductor layer 12n and portions of semiconductor layer 13p overlap each other in a z-axis direction (thickness direction). Specifically, both end portions of semiconductor layer 13p in x-axis direction are located above both ends portions of semiconductor layer 12n in x-axis direction. Insulating layer 18 is disposed between the portions of semiconductor layer 12n and the portions of semiconductor layer 13p that overlap each other in the z-axis direction.

Insulating layer 18 is disposed on semiconductor layer 12n. Specifically, insulating layer 18 is disposed on both end portions of semiconductor layer 12n in x-axis direction. Insulating layer 18 is not provided on a center portion of semiconductor layer 12n in x-axis direction.

Insulating layer 18 may be made of, for example, silicon oxide, silicon nitride, silicon oxynitride, titanium oxide, tantalum oxide, or the like. The thickness of insulating layer 18 is preferably 10 nm to 500 nm and more preferably 20 nm to 200 nm, for example.

N-side electrode 14 is disposed on semiconductor layer 12n. N-side electrode 14 is electrically connected to semiconductor layer 12n. On the other hand, p-side electrode 15 is disposed on semiconductor layer 13p. P-side electrode 15 is electrically connected to semiconductor layer 13p.

Electrodes 14, 15 may be made of, for example, a metal such as Cu or Ag, an alloy containing at least one of these metals, or the like. For example, electrodes 14, 15 may be also made of TCO (transparent conductive oxide) such as ITO (indium tin oxide). Each of electrodes 14, 15 may be formed of a multilayer of conductive layers each made of any of the aforementioned metals, alloys and TCO.

(Method of Manufacturing Solar Cell 1)

Figure 3:
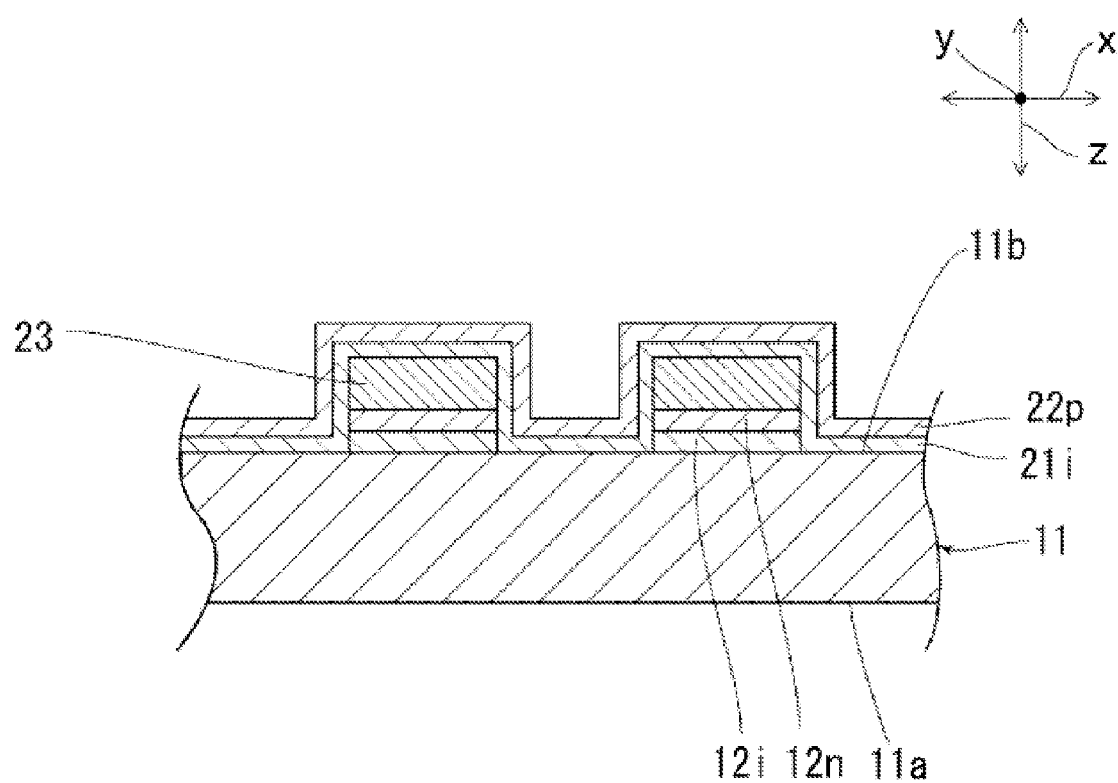
FIG. 3 is a schematic cross-sectional view for explaining a solar cell manufacturing process in the first embodiment.

Next, an example of a method of manufacturing solar cell 1 is described mainly by referring to FIG. 3.

To begin with, substrate 11 is prepared. Then, an i-type semiconductor layer, an n-type semiconductor layer and an insulating layer are formed in this order on second principal surface 11b of substrate 11, and then are patterned to form i-type semiconductor layer 12i, n-type semiconductor layer 12n and insulating layer 23 for forming insulating layer 18.

Here, the methods of forming the semiconductor layers and the insulating layer are not particularly limited. The semiconductor layers and the insulating layer may be each formed by use of any of thin film formation methods such as a CVD (chemical vapor deposition) method including a plasma CVD method and the like, and a sputtering method, for example.

Subsequently, i-type semiconductor layer 21i for forming i-type semiconductor layer 13i and p-type semiconductor layer 22p for forming p-type semiconductor layer 13p are formed in this order on principal surface 11b of substrate 11 in such a manner as to substantially entirely cover principal surface 11b including insulating layer 23. Semiconductor layers 21i, 22p may be each formed by use of any of thin film formation methods such as a CVD (chemical vapor deposition) method including a plasma CVD method and the like, and a sputtering method, for example.

Specifically, for example, p-type semiconductor layer 22p can be formed by a CVD method using a mixed gas containing SiH$_4$ gas, B$_2$H$_6$ gas and H$_2$ gas.

Thereafter, a texture structure is formed on principal surface 11a. To be specific, at least a portion of principal surface 11a (substantially the entire surface in a typical case) is subjected to a treatment with an aqueous alkaline solution, and thereby is anisotropically etched to form the texture structure. As an aqueous alkaline solution suitable for anisotropic etching, an aqueous solution of an alkali metal hydroxide can be cited such as a sodium hydroxide solution or a calcium hydroxide solution, for example.

After the formation of the texture structure on principal surface 11a, formation of semiconductor layers 17i, 17n and anti-reflection layer 16 on the side of the textured principal surface 11a, formation of semiconductor layers 13i, 13p by etching parts of semiconductor layers 21i, 22p and formation of insulating layer 18 by etching a part of insulating layer 23 on the side of the principal surface 11b, and formation of electrodes 14, 15 on the side of the principal surface 11b are performed in appropriate ways to complete solar cell 1.

In this embodiment, before the anisotropic etching using the aqueous alkaline solution, p-type semiconductor layer 22p containing boron is formed on at least a portion of principal surface 11b of substrate 11. P-type semiconductor layer 22p is highly resistant to the aqueous alkaline solution. In other words, p-type semiconductor layer 22p is sparingly soluble in the aqueous alkaline solution. For this reason, p-type semiconductor layer 22p functions as a protection film, and can suppress damage, erosion and denaturation of principal surface 11b caused due to the aqueous alkaline solution. Consequently, solar cell 1 with improved photoelectric conversion efficiency can be manufactured.

In this connection, one may conceive that a protection film for the case of using an aqueous alkaline solution is made of silicon nitride. However, the silicon nitride film tends to generate pin holes. Accordingly, it is difficult to surely protect the principal surface of a substrate by using the silicon nitride film.

In contrast, p-type semiconductor layer 22p hardly generates pin holes even when formed thinly. In other words, it is easy to form thin p-type semiconductor layer 22p inhibited from generating pin holes. Thus, p-type semiconductor layer 22p can favorably protect principal surface 11b from the aqueous alkaline solution.

Moreover, p-type semiconductor layer 22p can be controlled in film properties and film thickness more easily than the silicon nitride film.

In addition, the silicon nitride film is difficult to remove by etching. However, p-type semiconductor layer 22p can be removed easily as needed by using fluoro-nitric acid or the like.

This embodiment is described for the example in which p-type semiconductor layer 22p containing boron is used as the protection film for the aqueous alkaline solution used in the anisotropic etching. However, the invention should not be limited to this example. For example, a p-type semiconductor layer can be favorably used as a protection film for an aqueous alkaline solution used for washing in a solar cell manufacturing process.

The p-type semiconductor layer as the protection film may be amorphous or microcrystalline. That is to say, the p-type semiconductor layer in the invention may be an amorphous layer or an amorphous layer containing microcrystals.

This embodiment is described for the example in which the aqueous alkaline solution treatment the manufacturing of back contact solar cells 1 uses p-type semiconductor layer 22p as a protection film in an aqueous alkaline solution treatment. However, the configuration to which the invention is applicable should not be limited to this. For example, manufacturing of solar cells in which a p/i/n semiconductor junction is provided on one principal surface side of a substrate made of a crystalline semiconductor material while an n/i/n semiconductor junction is provided on the other principal surface side of the substrate also favorably can use a p-type semiconductor layer as a protection film for an aqueous alkaline solution in an aqueous alkaline solution treatment. In other words, in the invention, the solar cell is any solar cell not particularly limited, as long as the solar cell includes a substrate made of a crystalline semiconductor material.

Hereinafter, another example of a preferred embodiment of the invention is described. In the following description, components having substantially common functions to those in the foregoing first embodiment are referred to with the common reference numerals and are omitted from explanation.

Second Embodiment

In the first embodiment, the description is provided for the example in which p-type semiconductor layer 22p for forming p-type semiconductor layer 13p is used as the protection film for the aqueous alkaline solution. To put it differently, in the first embodiment, the description is provided for the example in which p-type semiconductor layer 22p used as the protection film for the aqueous alkaline solution is used to fabricate p-type semiconductor layer 13p forming semiconductor junctions. However, the invention should not be limited to this example.

Figure 4:
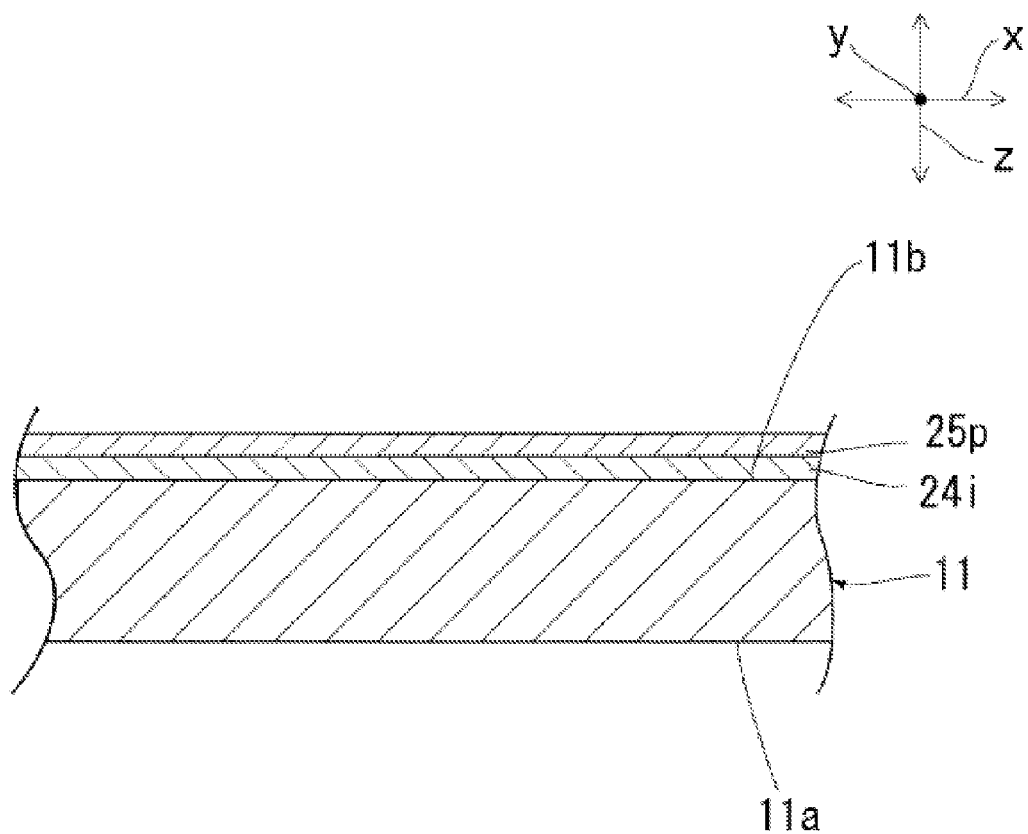
FIG. 4 is a schematic cross-sectional view for explaining a solar cell manufacturing process in a second embodiment.

For example, as illustrated in FIG. 4, i-type semiconductor layer 24i and p-type semiconductor layer 25p may be formed on principal surface 11b. These semiconductor layers 24i, 25p may be used as a protection film for an aqueous alkaline solution. Then, after removal of semiconductor layers 24i, 25p, semiconductor layers 21i, 22p may be newly formed. In this case, semiconductor layers 21i, 22p may be prevented from being damaged or denatured due to the aqueous alkaline solution. In addition, as for semiconductor layer 22p for use to form semiconductor junctions, the boron concentration in semiconductor layer 22p is determined depending on desired performance specifications and other factors of a solar cell. However, semiconductor layer 25p is free from such design constraints. Accordingly, the boron concentration in semiconductor layer 25p can be set within a range more suitable to a protection film for an aqueous alkaline solution. For example, if the boron concentration in semiconductor layer 25p is set higher than the boron concentration in p-type semiconductor layer 13p, the resistance of semiconductor layer 25p to an aqueous alkaline solution is made higher than the resistance of semiconductor layer 13p to the aqueous alkaline solution. Thus, it is possible to manufacture solar cells with further improved photoelectric conversion efficiency.

In the second embodiment, the description is provided for the example in which not only p-type semiconductor layer 25p containing boron, but also substantially-intrinsic i-type semiconductor layer 24i is formed as the protection film for the aqueous alkaline solution. However, the invention should not be limited to this example. Only p-type semiconductor layer 25p may be formed as a protection film.

The invention claimed is:

1. A method of manufacturing a solar cell including a substrate made of a crystalline semiconductor material, comprising:

depositing a p-type semiconductor layer containing boron on at least part of a first principal surface of the substrate, thereby protecting the at least part of the first principal surface to a subsequent etching or washing step;

etching or washing at least part of a second principal surface of the substrate by subjecting the at least part of the second principal surface to a treatment with an aqueous alkaline solution;

patterning the p-type semiconductor layer by removing a part of the p-type semiconductor layer after the treatment with the aqueous alkaline solution; and forming electrodes on the pattered p-type semiconductor layer and on an exposed area that is exposed through the removed part of the p-type semiconductor layer, respectively, and forming a semiconductor junction, wherein the semiconductor junction forming step comprises:

removing the p-type semiconductor layer; and forming a new semiconductor layer containing boron at a lower concentration than that in the p-type semiconductor layer, on the first principal surface to form the semiconductor junction, after the removing step.

2. The method according to claim 1, wherein the etching or washing step is a step of anisotropically etching the at least part of the second principal surface of the substrate with the aqueous alkaline solution.

3. The method according to claim 1, wherein the solar cell is a back contact solar cell.

4. The method according to claim 1, wherein silicon nitride film is not used to protect the substrate from the etching or washing step.

5. A method of manufacturing a solar cell including a substrate made of a crystalline semiconductor material, comprising:

depositing a p-type amorphous silicon layer containing boron on at least part of a first principal surface of the substrate, thereby protecting the at least part of the first principal surface to a subsequent etching or washing step;

etching or washing at least part of a second principal surface of the substrate by subjecting the at least part of the second principal surface to a treatment with an aqueous alkaline solution; and patterning the p-type amorphous silicon layer by removing a part of the p-type amorphous silicon layer after the treatment with the aqueous alkaline solution; and forming electrodes on the pattered p-type amorphous silicon layer and on an exposed area that is exposed through the removed part of the p-type amorphous silicon layer, respectively; and forming a semiconductor junction, wherein the semiconductor junction forming step comprises:

removing the p-type amorphous silicon layer; and forming a new semiconductor layer on the first principal surface to form the semiconductor junction, after the removing step, wherein the new semiconductor layer contains boron, and a boron concentration in the new semiconductor layer is lower than a boron concentration in the p-type amorphous silicon layer.

6. The method according to claim 5, wherein the etching or washing step is a step of anisotropically etching the at least part of the second principal surface of the substrate with the aqueous alkaline solution.

7. The method according to claim 5, wherein the solar cell construction is a back contact solar cell.

8. The method according to claim 5, wherein silicon nitride film is not used to protect the substrate from the etching or washing step.

* * * * *